United States Patent [19]

Iwai

[11] Patent Number: 4,792,650
[45] Date of Patent: Dec. 20, 1988

[54] MODULE MOUNTING SYSTEM
[75] Inventor: Masahiro Iwai, Nara, Japan
[73] Assignee: Sharp Kabushiki Kaishi, Osaka, Japan
[21] Appl. No.: 77,242
[22] Filed: Jul. 24, 1987
[30] Foreign Application Priority Data Jul. 24, 1986 [JP] Japan .................................. 61-174823
Jul. 31, 1986 [JP] Japan .................................. 61-181698

[51] Int. Cl.⁴ .............................................. H01H 9/20
[52] U.S. Cl. .................... 200/50 A; 200/334;
200/16 D; 200/50 R; 361/331
[58] Field of Search ...................... 200/17 R, 46, 50 A,
200/50 C, 16 C, 16 D, 52 R, 61.58 R, 61.62,
334, 50 R; 439/911; 361/380, 390, 391, 392,
393, 394, 395, 397, 399

[56] References Cited

U.S. PATENT DOCUMENTS

| 1,904,911 | 4/1933 | Willoughby | 200/50 A |
| 3,192,334 | 6/1965 | Dimond et al. | 200/50 A |
| 3,978,304 | 8/1976 | Salvati et al. | 200/50 A X |
| 4,504,707 | 3/1985 | Ochiai | 200/42 R |
| 4,563,552 | 1/1986 | Fushimoto | 200/50 A X |
| 4,638,129 | 1/1987 | Partus et al. | 200/50 A X |

FOREIGN PATENT DOCUMENTS 3147056 8/1983 Fed. Rep. of Germany .

Primary Examiner—J. R. Scott
Attorney, Agent, or Firm—Birch, Stewart, Kolasch & Birch

[57] ABSTRACT

A module mounting system for an electronic device capable of mounting a pair of electronic components each including a locking groove. The mounting system includes an operation switch having an engaging member to be engaged with the locking groove in each of the electronic components mounted on the electronic device. The operation switch provides a locking position to make the engaging member fit in the locking grooves simultaneously and a plurality of unlocking positions for unlocking one of the components selectively. The operation switch shuts off power supply to the electronic device when set at any of the unlocking positions, or supplies power to the electronic device when set at the locking position.

4 Claims, 11 Drawing Sheets

FIG. 15
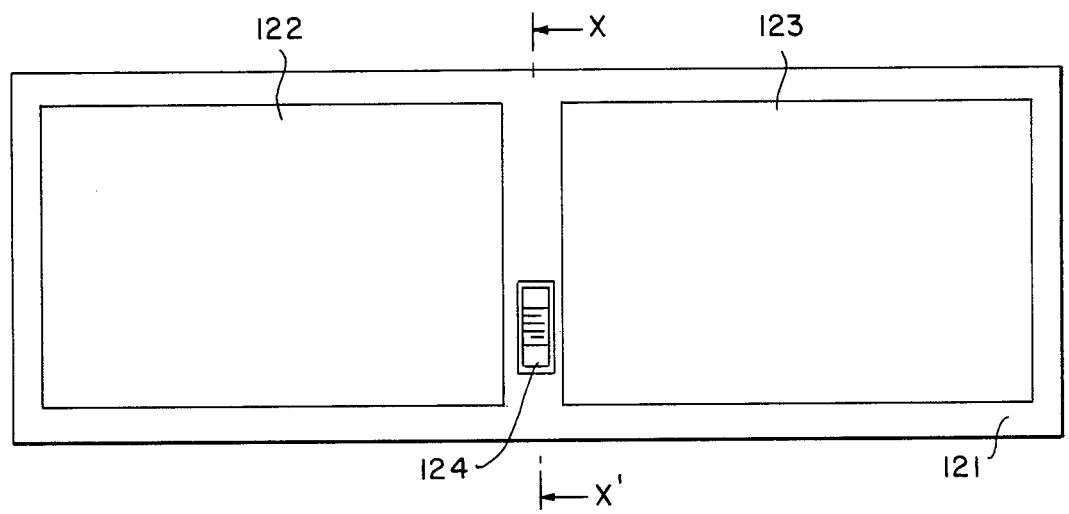
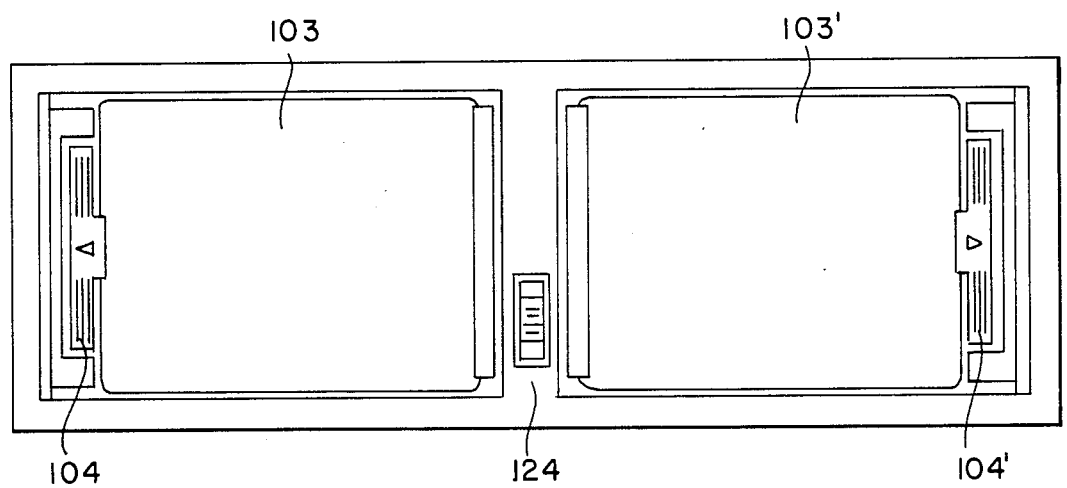
FIG. 16

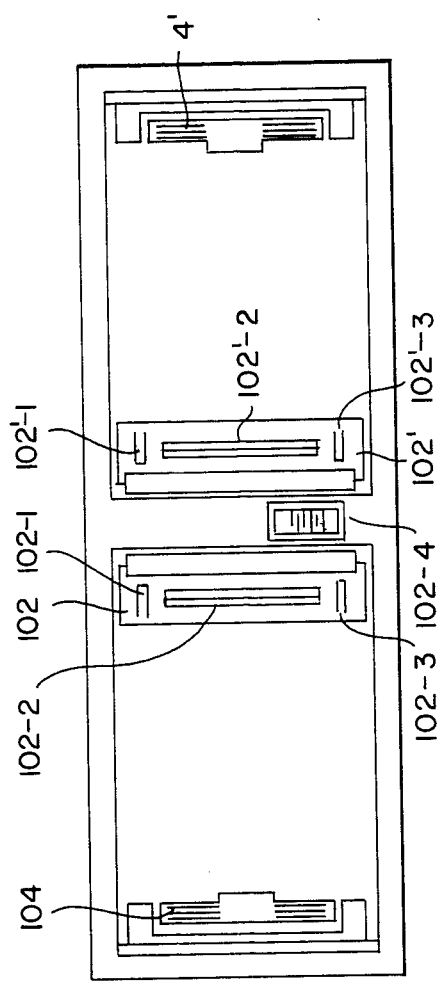
FIG. 17
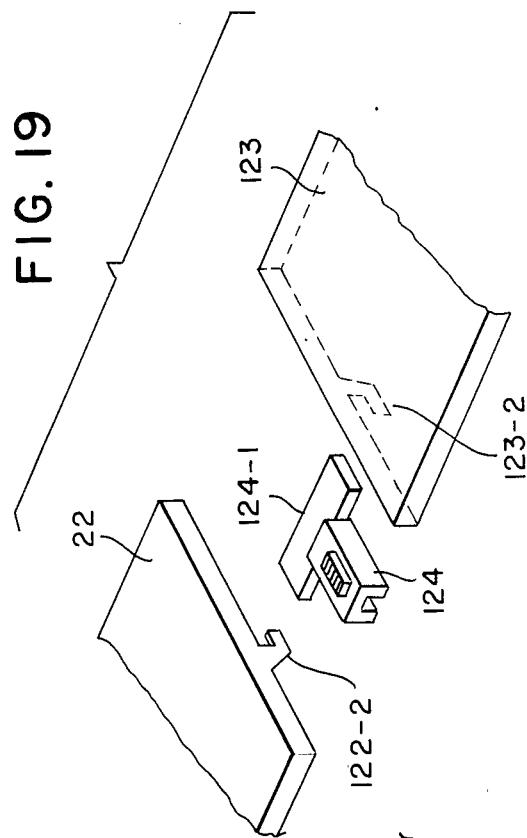
FIG. 19
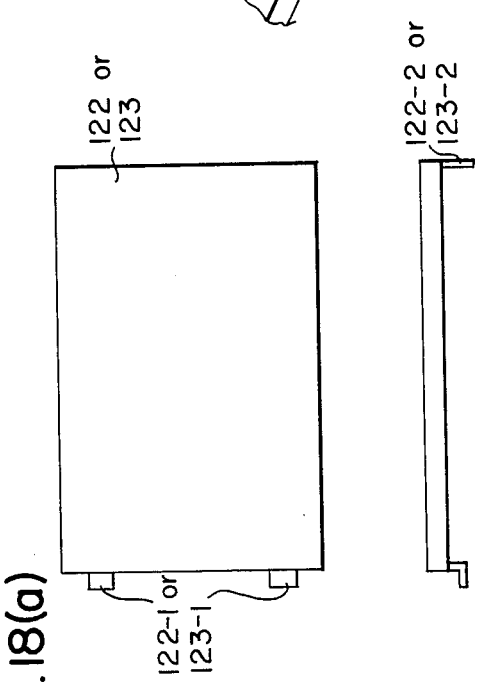
FIG. 18(a)
FIG. 18(b)

MODULE MOUNTING SYSTEM

BACKGROUND OF THE INVENTION

The present invention relates to a mounting system suitable for an electronic device such as a computer capable of mounting a plurality of card-shaped memory modules.

Conventionally, a so-called a pocket computer designed for program computation uses card-shaped memory modules called memory cards for storing necessary programs and data. The conventional pocket computer requires only one mounting system if it accommodates only one memory module. When it is designed for accommodating a plurality of memory modules, however, it requires mounting systems in the same quantity as the modules to be mounted.

FIG. 14 is a rear view of the conventional computer that can mount two memory modules 2 and 3. On a bottom plate 4 of the computer 1 are mounted lids 5 and 6 for mounting the memory modules 2 and 3, respectively. Slide switches 7 and 8 are provided on the right of the lids 5 and 6, respectively, to lock the same. The slide switches 7 and 8 also sevve as power switches. When the slide switch 7 is moved to the upper position, for example, the end of the lid 5 to the side of the slide switch 7 is lifted so that the lid 5 can be removed. With this state, if the slide switch 8 is moved to the upper position, the lid 6 is lifted, and power supply is simultaneously interrupted.

According to the above prior art, it is necessary to furnish the computer with the module mounting systems including the slide switches in the same quantity as the memory modules to be mounted on the computer. As a result, the module mounting systems take a considerably large space in the computer main body. Considering this, the conventional module mounting system is not suitable for use with a compact computer. For protecting data in the memory module electrically, it is preferable that the computer power is turned off when the memory module is mounted on or removed from the computer main body. With the mounting system of the prior art, it is necessary to turn off not only the power switch (slide switch) for a module to be mounted or removed but also the power switch (slide switch) for the other module which is not to be mounted or removed. Thus, according to the prior art, operation of mounting or removing memory modules is very troublesome.

SUMMARY OF THE INVENTION

An object of the present invention is to solve the above problem by providing a mounting system for an electronic device which system is simple in structure and remarkably improves the operability of the mounting system and device.

Another object of the present invention is to provide a module mounting system in which a power switch knob is shared for a plurality of modules to be mounted so as to minimize the space requirement of the power switch as well as to reduce the cost for parts, and in which power supply to the electronic device is shut off when one of the modules is removed.

To achieve the above first object, according to the present invention, a mounting system, in an electronic device capable of mounting a pair of electronic components each having a locking groove, comprises operation means having an engaging member for engagement with said locking groove, the operation means providing a locking position in which the engaging member is fit in the locking grooves to lock the electronic components and a plurality of unlocking positions in which one of the electronic components is selectively released from engagement with the corresponding locking groove, the operation means turning off power of the electronic device when set at any of the plurality of unlocking positions and turning on the device when set at the locking position.

To achieve the above second object, according to the present invention, a module mounting system for an electronic device comprises mounts provided on the device main body to accommodate a plurality of memory card modules, the mounts connecting the modules electrically with the device main body; module lids removably fit in the respective mounts, a locking projection extending from each of the module lids to each of the mounts; a slide switch for turning on and off the electronic device and the modules mounted on the device; and an engaging member interlocking with the operation knob of the slide switch so as to be engaged wihh or disengaged from the locking projections of the module lids depending upon the switch position.

BRIEF DESCRIPTION OF THE DRAWINGS

The present invention will become more fully understood from the detailed description given hereinbelow and the accompanying drawings which are given by way of illustration only, and thus are not limitative of the present invention and wherein:

FIG. 15 is a rear view of the programmable computer of a second embodiment of the invention;

FIG. 16 is a rear view of the programmable computer of FIG. 15 with the module lids removed;

FIG. 17 is a rear view of the programmable computer of FIG. 15 from which the memory card modules are removed;

FIGS. 18(a) and 18(b) are a plan view and a side view, respectively, of the module lid;

FIG. 19 shows the relationship between the slide switch and the module lids;

DESCRIPTION OF THE PREFERRED EMBODIMENTS

Figure 1:
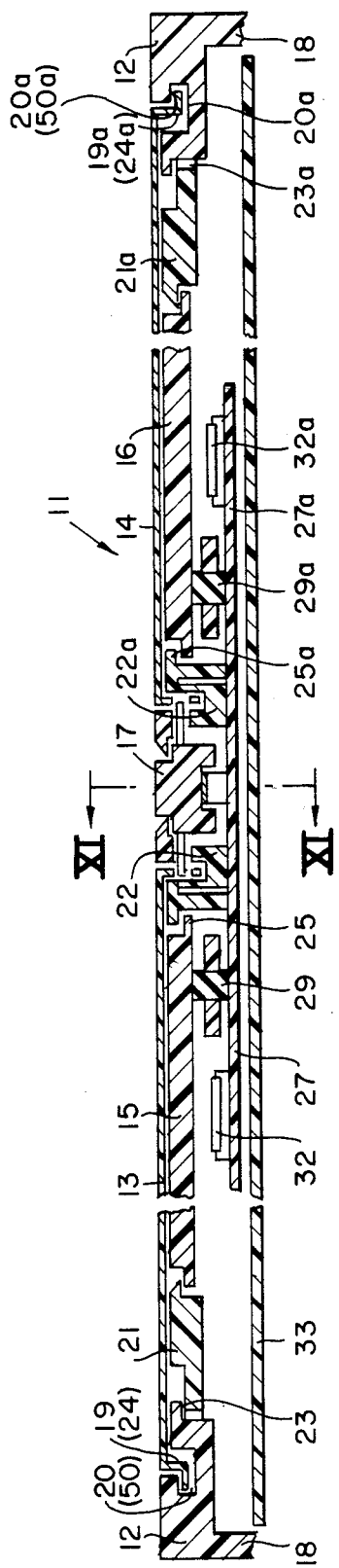
FIG. 1 is a sectional view of the computer 11 of an embodiment of the present invention.
Figure 2:
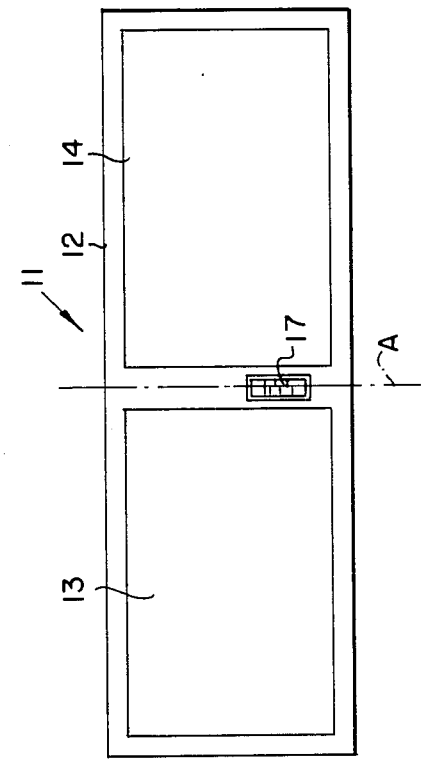
FIG. 2 is a rear view of the computer 11 with the lids 13 and 14 mounted on the bottom plate 12 of the computer.
Figure 3:
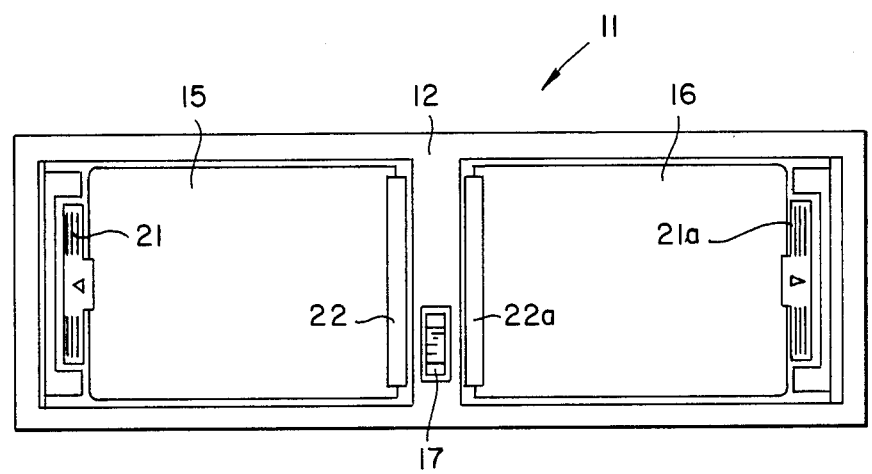
FIG. 3 is a rear view of the computer 11 without the lids 13 and 14.
Figure 4:
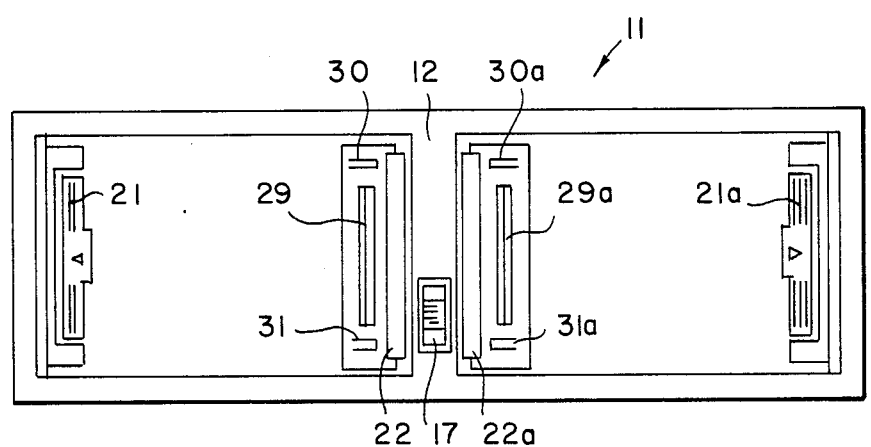
FIG. 4 is another rear view of the computer 11 from which the memory modules 15 and 16 are removed.
Figure 5:
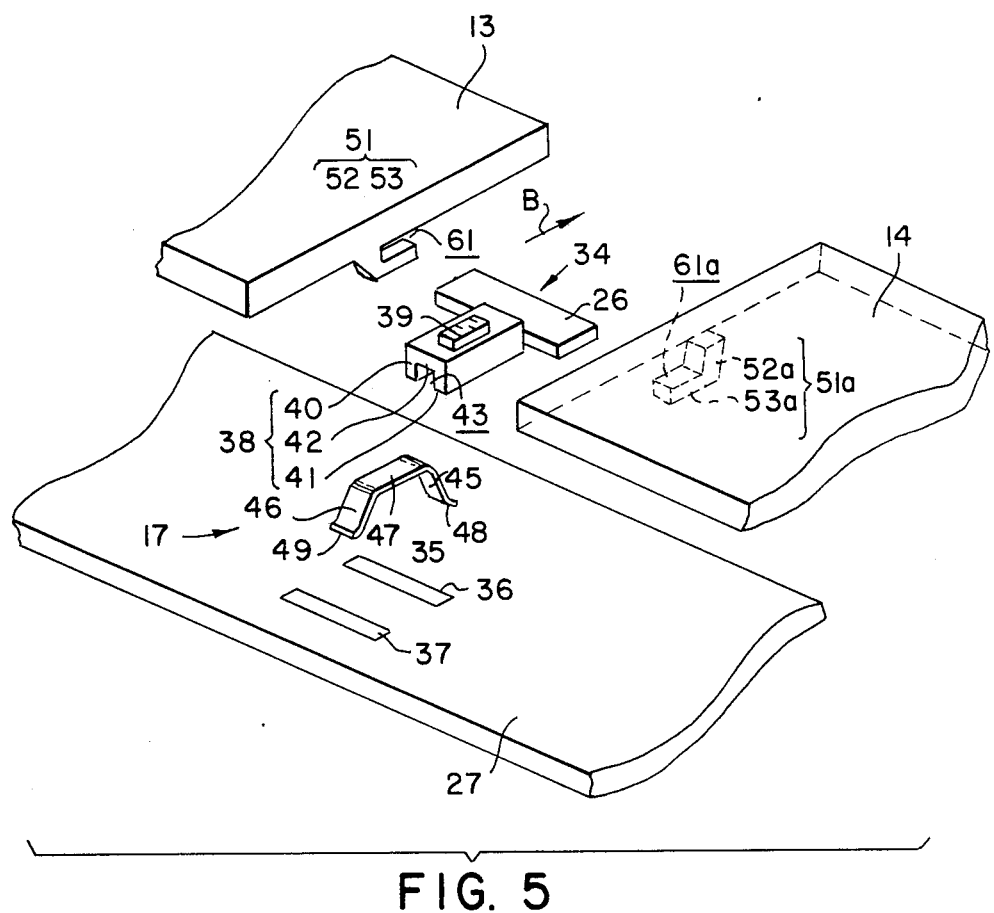
FIG. 5 is an exploded perspective view of the slide switch 17 and the surrounding parts.

FIG. 1 is a sectional view of the computer 11 of the first embodiment of the present invention, FIG. 2 is a rear view of the computer 11 with module lids 13 and 14 mounted on a bottom plate 12 of the computer 11, FIG. 3 is a rear view of the computer 11 with the lids 13 and 14 removed from the bottom plate 12, FIG. 4 is a rear view of the computer 11 from which memory modules 15 and 16 (described later) are removed; and FIG. 5 is an exploded perspective view of a slide switch 17 (described later) and its surrounding parts.

The computer 11 related to the present invention is socalled a pocket computer capable of program computation. In the present embodiment, the computer 11 can accommodate two memory modules 15 and 16. The memory modules 15 and 16 which have almost the same size and shape as a credit card contain a RAM (Random Access Memory) that stores necessary programs and data.

The mounting system for the lids 13 and 14 and the memory modules 15 and 16 on the computer 11 is now described with reference to FIGS. 1 through 5. The computer 11 includes, on its rear side (the upper side of FIG. 1), the two memory modules 15 and 16, the lids 13 and 14 mounted over (the upper side of FIG. 1) the memory modules 15 and 16, respectively, the slide switch 17 for locking or unlocking the lids 13 and 14, and a cabinet 18 for securely housing the above-mentioned parts. In the present embodiment, since the mounting system for the memory modules 15 and 16 is symmetrical with respect to the plane perpendicular to the drawing paper surface including the chain double-dashed line A of FIG. 2, description is made only on the mounting system for the lid 13 and the memory module 15 (in the left side of FIG. 2). The parts in the right mounting system corresponding to those in the left mounting system are allotted with reference numbers having an index "a".

Referring to FIG. 1, engaging recesses 20 and 50 are formed on the bottom plate 12, which is formed on the left end of the cabinet 18. Engaging projections 19 and 24 (later described) formed on one end of the lid 13 are fit into the recesses 20 and 50, respectively. A groove 23 is formed on the right of the engaging recesses 20 and 50, for retaining a module-fixing slider 21 (later described). A supporting member 22 is molded integrally with the cabinet 18 on the left of the slide switch 17. A projection 25 for retaining the memory module 15 extends from the upper part of the supporting member 22 toward the slider 21.

Thus, the memory module 15 is mounted on the computer main body 11, with an end thereof being held by the retaining projection 25 of the supporting member 22, and with the opposite end by the slider 21, while the lid 13 is mounted on the computer main body 11, with an end thereof fit into the two engaging recesses 20 and 50 of the bottom plate 12, and with the opposite end held by an engaging member 26 (described later) of the slide switch 17.

A printed circuit board 27 is provided under the memory module 15 mounted on the computer 11. A conducting rubber 29 is set on the PC board 27 on the left of the supporting member 22. The conducting rubber 29 comprises alternate layers of conductive rubber and insulating rubber. The conducting rubber 29 connects a plurality of electrodes on the memory module 15 to the corresponding electrodes on the PC board 27, independently.

Referring to FIG. 4, power supply electrodes 30 and 31 comprising a metal leaf spring are provided near the upper and lower ends of the conducting rubber 29, respectively. The memory module 15 mounted on the computer 11 is fed with power through these electrodes 30 and 31 (The memory module 15 has a built-in battery for protection of stored data). The conducting rubber 29 also serves as a signal electrode.

The conducting rubber 29 provides resiliency in the vertical direction of FIG. 1, helping the memory module 15 to be lifted as described in a later page. An electronic component 32, say, an IC is mounted on the PC board 27 on the left (of FIG. 1) of the conducting rubber 29. Another PC board 33 is provided under the PC board 27 as shown in FIG. 1.

Now, description is made in detail on the slide switch 17 with reference to FIG. 5. The slide switch 17 includes an operation section 34, a spring 35 and two contacts 36 and 37 embedded in the PC board 27. In order to power the computer 11, it is essential that the contacts 36 and 37 conduct electrically to each other. The operation section 34 comprises the engaging member 26, a sliding block 38 and an operation knob 39. The sliding block 38 is of |-shape in cross section, comprising two perpendicular portions 40 and 41 parallel to each other and a horizontal portion 42 joining the upper ends of the perpendicular portions 40 and 41. The perpendicular portions 40 and 41 and the horizontal portion 42 define a fitting groove 43 described later.

The engaging member 26 comprises a flat plate elongating in the direction vertical to the arrow B of FIG. 5. The engaging member 26 is secured to the end of the sliding block 38 on the downstream side of the arrow B. The operation knob 39 is secured on its bottom side to the horizontal portion 42 of the sliding block 38. A plurality of ridges vertical to the direction of the arrow B are formed in the top surface of the operation knob 39.

The spring 35 of U-shape is made of a resilient metal plate, comprising a pair of leg portions 45 and 46 and a bridge portion 47 therebetween. The distance between the leg portions 45 and 46 increases as they are remoter from the bridge portion 47. The free ends of the leg portions 45 and 46 are provided with sliding surfaces 48 and 49 which are to be made in touch with the contacts 36 and 37, respectively. The spring 35 is fixed to the sliding block 38 of the operation section 34 by being fit in the fitting groove 43 formed in the sliding block 38.

Figure 6:
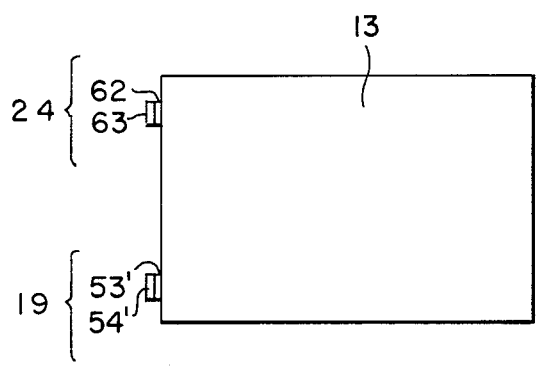
FIGS. 6 and 7 are a plan view and a side view, respectively, of the lid 13.
Figure 7:
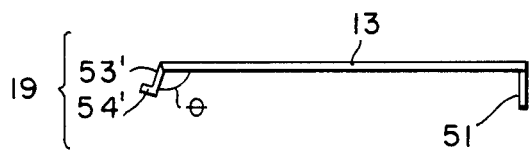

FIGS. 6 and 7 are a plan view and a side view, respectively, of the lid 13. As mentioned earlier, at an end of the lid 13 are provided two engaging projections 19 and 24 with a specified interval therebetween as shown in FIG. 6, so that the engaging projections 19 and 24 are fit in the engaging recesses 20 and 50, respectively, formed in the bottom plate 12 of the cabinet 18. At the other end of the cover 13 is formed a locking projection 51 for engagement with the engaging member 26 of the operation section 34 of the slide switch 17.

As shown in FIG. 5, the locking projection 51 is of hook shape extending in the direction of the arrow B, comprising a support 52 protruding from the lid 13 toward the PC board 27 and an engaging portion 53 extending in the direction of the arrow B from the end of the support 52. The locking projection 51 defines a locking groove 61 opening in the direction of the arrow B from the engaging portion 53 and under the lid 13. A locking projection 51a of the cover 14 has the same configuration as the locking projection 51 excepting that an engaging portion 53a extends in the direction opposite from the direction of the arrow B whereby a locking groove 61a defined by the locking projection 51a from the engaging portion 53 and under the lid 14 opens in the direction opposite from the direction of the arrow B.

Referring to FIG. 7, the engaging projection 19 comprises a support 53' protruding downward from the lid 13 and an engaging portion 54' extending from the end of the support 53' in the direction away from the locking projection 51. The angle formed between the support 53' and the lid 13 is a little larger than 90'. The engaging projection 24 has the same configuration as the engaging projection 19.

Figure 8:
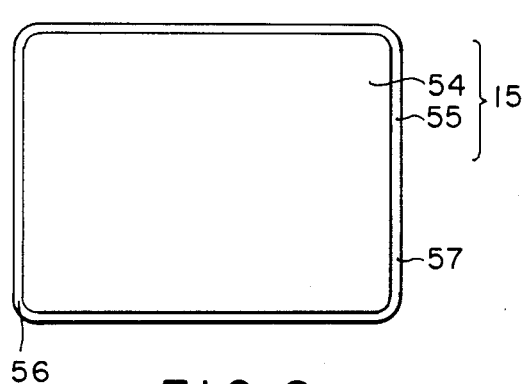
FIGS. 8 and 9 are a plan view and a side view, respectively, of the memory module 15.
Figure 9:
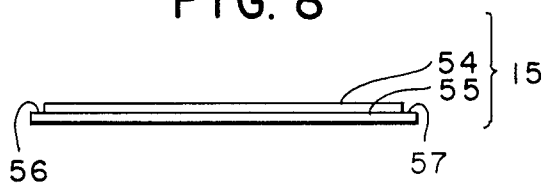

FIGS. 8 and 9 are a plan view and a side view, respectively, of the memory module 15. The memory module 15 comprises a top panel 54 and a chassis 55 which contains a PC board. In the rear of the chassis 55 is provided a contact to be connected electrically with the PC board 27. As shown in FIG. 8, the upper panel 54 is different in size from the chassis 55 whereby a step 56 or 57 is formed on each end of the memory module 15. The memory module 15 can be mounted on the computer main body 11 due to the steps 56 and 57.

Figure 10:
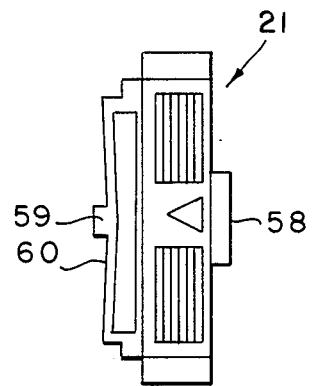
FIG. 10 is a plan view of a module-fixing slider 21.

FIG. 10 is a plan view of the module-fixing slider 21. The slider 21 has a projection 58 on the right side thereof, for engagement with the step 56 of the memory module 15. A hooped resilient member 60 having a protrusion 59 from the center thereof is provided on the slider 21 on the opposite side from the projection 58. The resilient member 60 is normally pressed rightward.

FIG. 11 is a sectional view of the slide switch 17 along the line XI—XI of FIG. 1. FIG. 12 explains the operation of the slide switch 17. The function of the slide switch 17 is now described in detail with reference to FIGS. 2 through 5, 11 and 12.

Figure 11A:
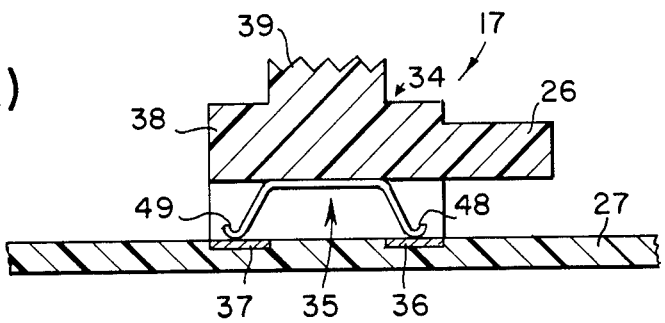
FIGS. 11(a), 11(b) and 11(c) are sectional operational views of the slide switch 17 along the line XI—XI of FIG. 1.
Figure 12A:
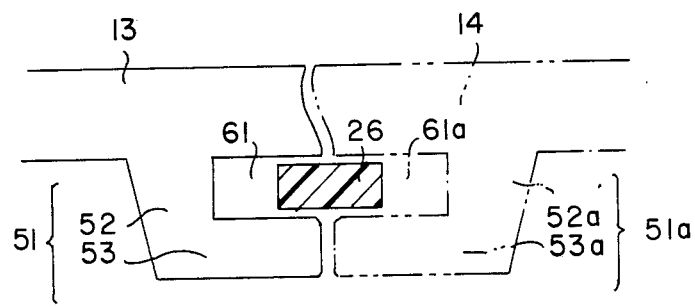
FIGS. 12(a)–12(c) explain the function of the slide switch 17.

In FIGS. 11A and 12A, the slide switch 17 is set at N (neutral) position, making the sliding surfaces 48 and 49 of the spring 35 of the slide switch 17 in touch with the contacts 36 and 37 on the PC board 27. In this state, the two contacts 36 and 37 conduct to each other through the spring 35, which is an essential condition for the computer 11 to be powered. Since the engaging member 26 of the operation section 34 of the slide switch 17 is fit in the locking grooves 61 and 61a defined by the locking projections 51 and 51a of the lids 13 and 14, the lids 13 and 14 are locked to the computer main body 11 and therefore cannotbe removed from the latter.

Figure 11B:
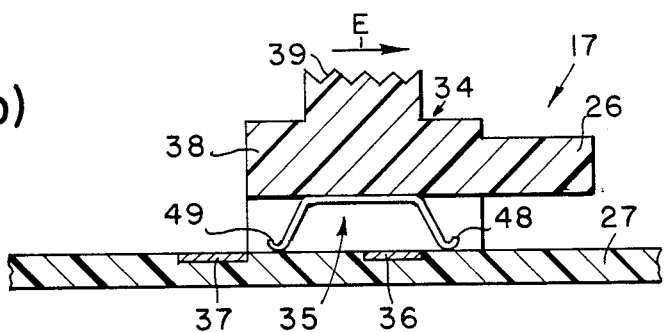
Figure 12B:
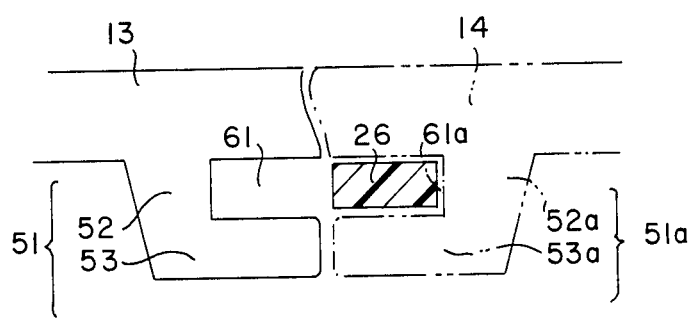

In FIGS. 11B and 12B, the slide switch 17 is set at U position (the upper position of FIG. 2). In this state, the sliding surfaces 48 and 49 of the spring 35 are displaced in the direction E (See FIG. 11B) from the neutral position, so that the electrical connection between the contacts 36 and 37 is lost. As a result, power is not supplied to the computer 11. Since the engaging member 66 of the slide switch 17 is fit in the locking groove 61a of the lid 14, the lid 14 is locked and therefore cannot be removed. Meanwhile, the engaging member 26 comes out of the eengagement with the locking groove 61 of the lid 13 so that the lid 13 is unlocked.

Figure 11C:
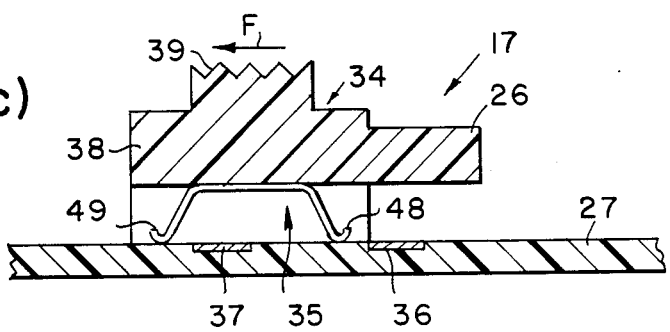
Figure 12C:
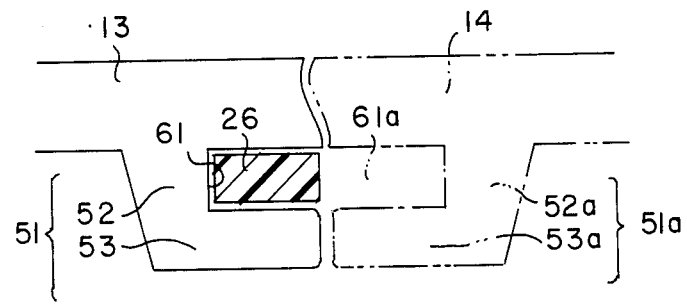

In FIGS. 11C and 12C, the slide switch 17 is set at D position (the lower position of FIG. 2). In this state, the sliding surfaces 48 and 49 of the spring 35 are displaced in the direction F (See FIG. 11C) from the neutral position whereby the electrical connection between the contacts 36 and 37 is lost. Consequently, power is not supplied to the computer 11. Since the engaging member 26 of the slide switch 17 is fit in the locking groove 61 of the lid 13, the lid 13 is locked, whereas the lid 13 is unlocked because the engaging member 26 has now come out of engagement with the locking groove 61a of the lid 14.

Figure 13:
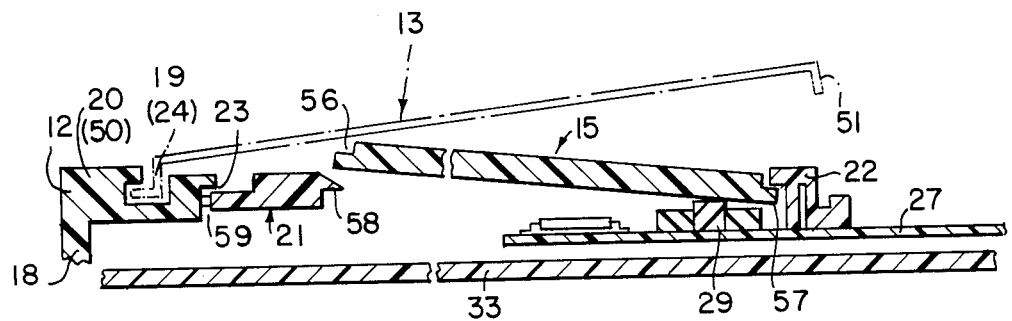
FIG. 13 shows the lid 13 and the memory module 15 in the process of being removed from the computer main body 11.
Figure 14:
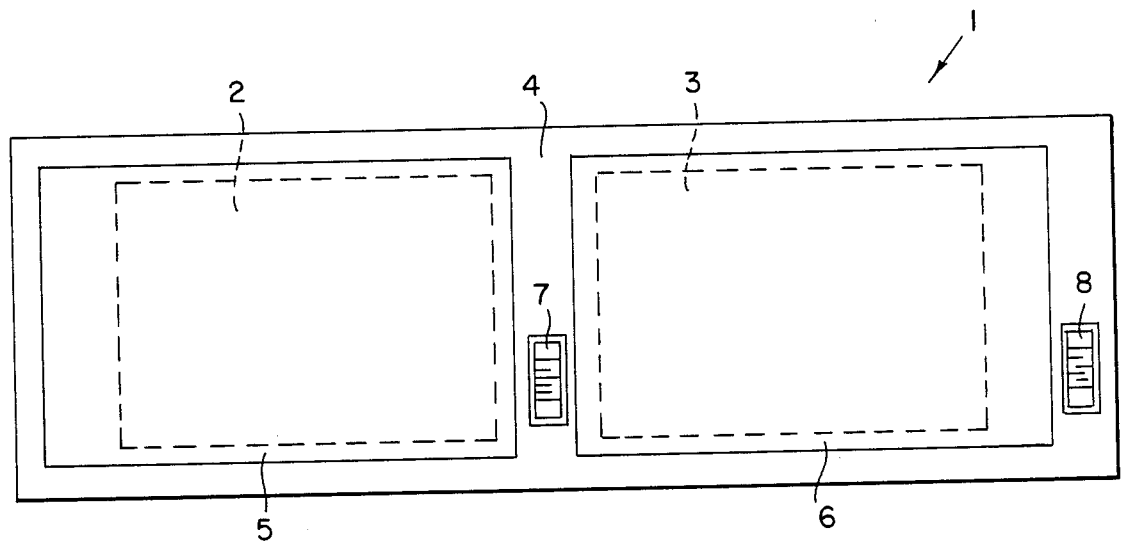
FIG. 14 is a rear view of the conventional computer, showing the mounting system of the prior art.

FIG. 13 shows the lid 13 and the memory module 15 in the process of being dismounted from the computer main body 11. As mentioned earlier, the lid 13 mounted on the computer 11 is retained at one end by the engaging recesses 20 and 50 in the bottom plate 12, and at the other end by the engaging member 26 of the slide switch 17. To effect this state, the slide switch 17 must be set at N (See FIG. 12A). (Here, it is assumed that the lid 14 has been set in the computer 11.) When the slide switch 17 is moved to U position (See FIG. 12B) to unlock the lid 13, the end of the lid 13 with the locking projection 51 is raised with the engaging projections 19 and 24 as a fulcrum due to the following mechanism.

The supports 53 and 62 of the engaging projections 19 and 24 make an obtuse angle with the lid 13 as described previously. The engaging portions at the ends of the engaging projections 19 and 24 of the lid 13 are retained in the engaging recesses 20 and 50, respectively. Consequently, when the lid 13 is unlocked by the slide switch 17, it is naturally raised at a specified angle unless an external force is applied to the lid 13. In other words, to mount the lid 13 on the computer 11, it is necessary to apply an external force to the lid 13 against the resilience of the engaging projections 19 and 24.

The procedure of mounting the memory module 15 is described now. First, the end of the memory module 15 with the step 57 is inserted in the supporting member 22. In this state, the memory module 15 is held slanted due to the conducting rubber 29, as shown in FIG. 13. Then the other end of the memory module 15 with the step 56 is depressed against the resilience of the conducting rubber 29, making the end with the step 56 in contact with the projection 58 of the slider 21. As shown in FIG. 13, the upper surface of the projection 58 is sloped toward the PC board 33 as it closes with the supporting member 22. Accordingly, as the end of the memory module 15 with the step 56 is further depressed, the projection 58 is forced leftward of FIG. 13 until the end of the memory module 15 with the step 56 passes past the projection 58. Then, the projection 58 returns to its original position due to the resilience of the resilient member 59, for engagement with the step 56 of the memory module 15, thus locking the memory module 15. To dismount the memory module 15, the slider 21 is moved leftward of FIG. 13 whereby the end of the memory module 15 with the step 56 is raised due to the resilience of the conducting rubber 29.

Thus, the memory module 15 can be mounted on the computer 11 simply by setting an end of the memory module 15 in the supporting member 22 and depressing the other end thereof. The memory module 15 can be dismounted easily by shifting the slider 21.

The lid 13 can ee also mounted on the computer 11 simply by supporting an end of the lid 13 and then holding the other end by the engaging member 26 of the slide switch 17, and can be removed easily by moving the slide switch 17. The procedure of mounting and dismounting the lid 14 is the same as that for the lid 13.

In the present embodiment of the invention, either of the lids 13 and 14 can be removed independently. Namely, even when one of the lids is dismounted, the other lid is kept locked; two lids 13 and 14 can never be lifted simultaneously. In addition, since the power supply circuit is broken by removing one of the lids, the memory module 15 can be taken out without destroying the data in the module 15.

According to the present invention, since the above advantageous effects are realized by one slide switch 17, it is possible to make the computer 11 small.

According to the above first embodiment of the present invention, as appreciated from above, it is possible to lock a pair of electronic components by common means on an electronic device capable of mounting the pair of components and to unlock desired one of the pair of components selectively. Power supply to the electronic device is interrupted when either one of the electronic components is unlocked. That is, the electronic device is powered only when both of the two components are locked on the electronic device.

Accordingly, when the mounting system of the present invention is applied to an electronic device in which a power supply circuit should be broken while one of a pair of electronic components is removed, power supply can be interrupted easily by a simple operation. Even further, since the pair of components is locked or unlocked by one operation means, the number of parts loaded on the electronic device is decreased.

A second embodiment of the present invention is described in the following.

FIG. 15 is a rear view of the programmable computer to which the module mounting system of the present invention is applied.

Referring to FIG. 15, 121 is a computer main body, 122 is a first module lid, 123 is a second module lid, and 124 is a slide switch for locking the first and second module lids 122 and 123. The slide switch 124 also serves as a power switch. When the slide switch 124 is set at the upper position, power of the computer 121 is turned off and the right side of the first module lid 122 is lifted, so that the first module lid 122 can be removed. At this time, the second module lid 123 remains locked in the computer main body 121.

When the slide switch 124 is set at the neutral position, power for the computer 121 is turned on, and both the first and the second module lids 122 and 123 are locked in the main body 121.

When the slide switch 124 is set at the lower position, the main body 121 is turned off and the left side of the second module lid 123 is lifted so that the second module lid 123 can be removed. In this case, the first module lid 122 remains locked in the computer main body 121.

FIG. 16 is a rear view of the computer from which the first and second module lids 122 and 123 are removed. Elements 103 and 103' are card-shaped modules. Elements 104 and 104' are module-fixing sliders.

FIG. 17 is a rear view of the computer from which the modules 103 and 103' are removed. Elements 102 and 102' are electrodes for connecting the modules 103 and 103' electrically with the computer main body 121. Elements 102-1, 102-3, 102'-1 and 102'-3 are power supply electrodes each comprising a metal leaf spring. Elements 102-2 and 102'-2 are signal electrodes each comprising a zebra connector. FIGS. 18(a) and 18(b) are a plan view and a side view, respectively, of the module lid 122 or 123. 122-1 or 123-1 is an engaging craw, and element 122-1 123-2 is a locking projection. Since the first and second module lids 122 and 123 have completely the same configuration, they may be replaced with each other.

Referring to FIG. 19 which shows the relationship between the slide switch 124 and the first and second module lids 122 and 123, 124-1 is an engaging member formed integrally with the slide switch knob. The first and/or second module lids 122 and/or 123 are locked when the engaging member 124-1 is fit in the locking projections 122-2 and/or 123-2.

Figure 20A:
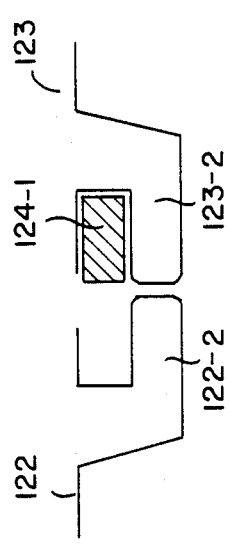
FIGS. 20(a) through 20(c) show how the module lids are locked or unlocked by the engaging member of the slide switch.
Figure 20B:
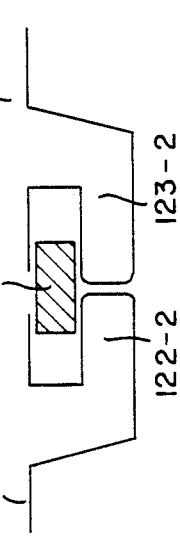
Figure 20C:
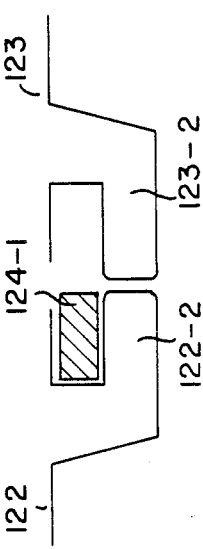

FIGS. 20(a) through 20(c) show the positions of the engaging member 124-1 of the slide switch 124 in relation to the locking projections 122-2 and 123-2 of the first and second module lids 122 and 123, respectively.

When the slide switch 124 is set at the upper position (See FIG. 15.), the second module lid 123 is locked by the engaging member 124-1 engaged with the locking projection 123-2 of the second module lid 123 while the first module lid 122 is not locked (Refer to FIG. 20(a).)

When the slide switch 124 is set at the neutral position as shown in FIG. 20(b), the engaging member 124-1 of the slide switch 124 is engaged with the locking projection 122-2 of the first module lid 122 and locking projection 123-2 of the second module lid 123, thereby locking both of the first and second module lids 122 and 123.

In FIG. 20(c) where the slide switch 124 is set at the lower position of FIG. 15, the first module lid 122 alone is locked.

When the module 103 or 103' is removed, the engaging member 124-1 of the slide switch 124 is either in the position shown in FIG. 20(a) or in the position shown in FIG. 20(c). According to the present invention, power of the computer main body 121 is turned off when the slide switch 124 is in either of the above two positions due to the mechanism shown in FIGS. 21(a) through 21(c).

Figure 21A:
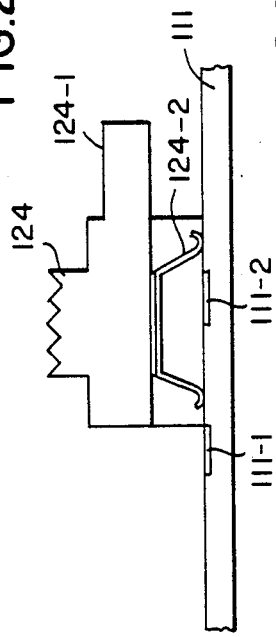
FIGS. 21(a) through 21(c) show the positions of the slide switch knob and the corresponding positions of slide contacts.
Figure 21B:
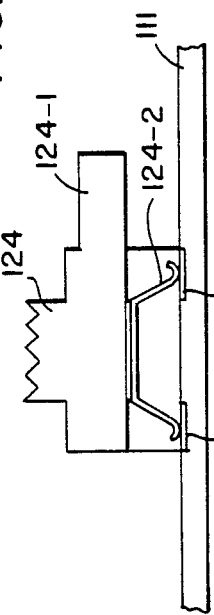
Figure 21C:
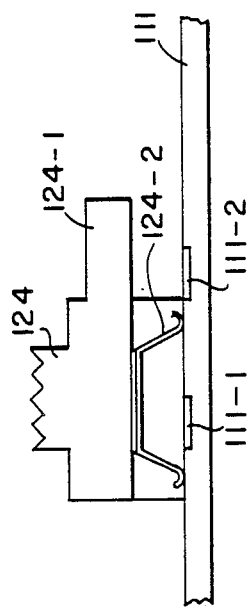

FIGS. 21(a) through 21(c) are sectional views of the slide switch 124 along the line X-X' of FIG. 15. Element 124-2 is a slide contact to be made in touch with a PC board 111. Elements 111-1 and 111-2 are circuit patterns formed on the PC board 111. When the slide switch 124 is set at the position shown in FIG. 20(a), the circuit patterns 111-1 and 111-2 are not powered because they do not conduct to each other.

With the slide switch 124 set at the position shown in FIG. 20(b), the circuit patterns 111-1 and 111-2 conduct to each other through the slide contact 124-2 so that they are powered.

With the slide switch 124 set at the position shown in FIG. 20(c), the contact patterns 111-1 and 111-2 are not powered as they are not in FIG. 20(a).

Figure 22:
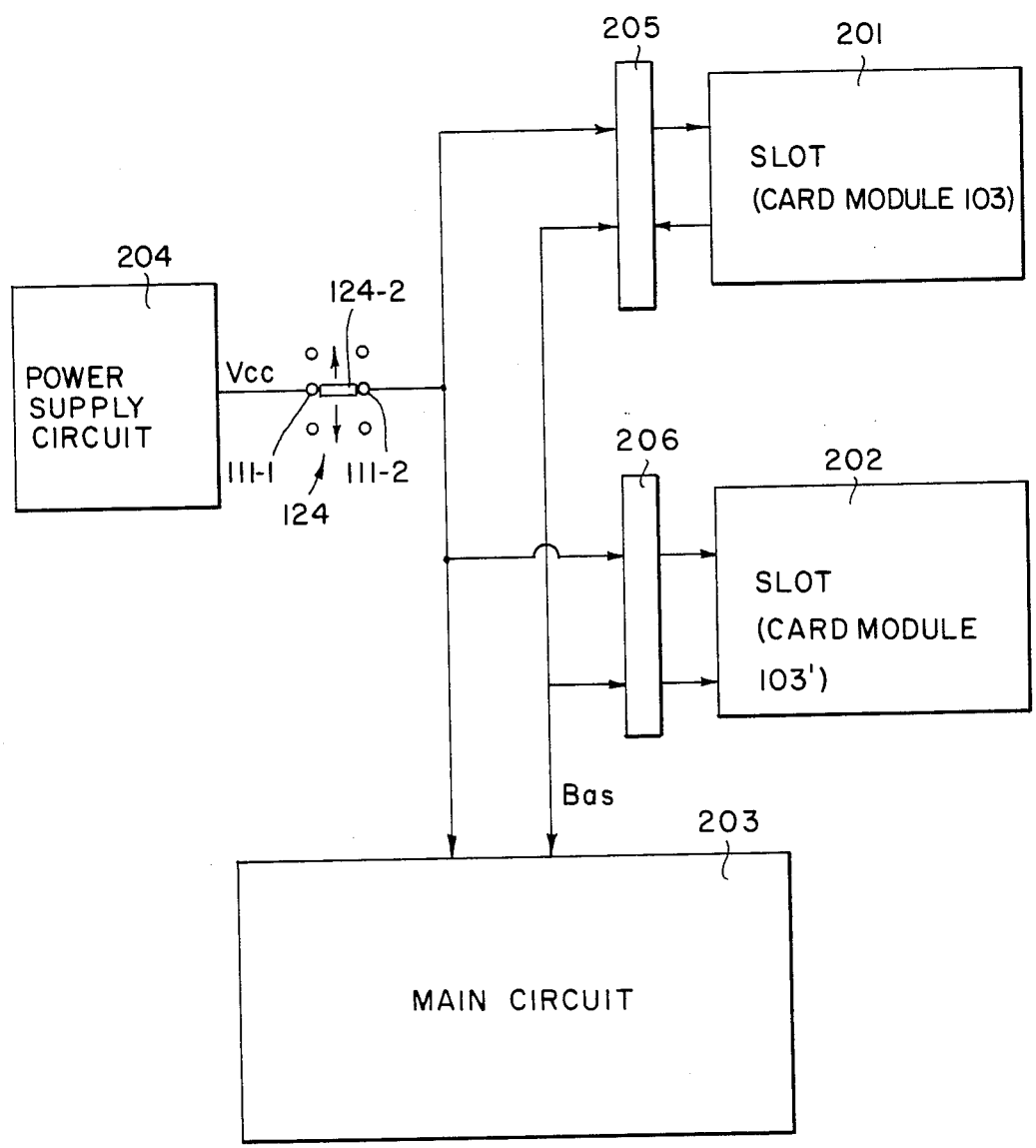
FIG. 22 is a circuit block diagram of the module mounting system of the present invention.

FIG. 22 shows the circuit construction of the module mounting system of the present invention.

Referring to FIG. 22, slots 201 and 202 correspond to the memory card modules 103 and 103' which are connected to the main circuit 203 of the programmable computer via connectors 205 and 206, respectively. The slots 201 and 202 and the main circuit 203 are fed with power Vcc from a power supply circuit 204 through the slide switch 124 whose function has been already described with reference to FIG. 21.

When the card module 103 or 103' is removed for replacement, the slide switch 124 is at either the upper or the lower position so that the slide contact 124-2 is displaced from the circuit patterns 111-1 and 111-2. Consequently, power supply to the main circuit 203 as well as to the slots 201 and 202 is interrupted when the module 103 or 103' is removed.

According to the present invention, as understood from the above, the slide switch serves to lock or unlock the engagement of the plurality of module lids with the main body. The main body and the plurality of card modules mounted thereon are powered as long as the module lids are locked with the main body. If one of the module lids is unlocked, power will not be supplied to the main body or to the card modules mounted on the main body.

Thus, according to the second embodiment of the present invention, the module lids for the plurality of card modules are locked or unlocked by a single slide switch which also serves to turn on or off the computer main body and the card modules mounted on the main body. As a result, the module mounting system of the present invention involves a smaller number of parts in mounting the plurality of card modules electrically and mechanically on the computer main body, and requires less space for mounting the card modules.

While only certain embodiments of the present invention have been described, it will be apparent to those skilled in the art that various changes and modifications may be made therein without departing from the spirit and scope of the present invention as claimed.

What is claimed is:

1. In an electronic device capable of mounting a pair of electronic components each including a locking groove, a mounting system comprising operation means having an engaging member to be engaged with said locking groove in each of said components mounted on the electronic device, said operation means providing a locking position to make said engaging member fit in said locking grooves simultaneously and a plurality of unlocking positions for unlocking one of said components selectively, said operation means shutting off power supply to the electronic device when set at any of the unlocking positions, or supplying power to the electronic device when set at the locking position.

2. A module mounting system for an electronic device, comprising:
a plurality of mounts formed in the electronic device main body to allow a plurality of card modules to be set and connected electrically with the electronic device main body;
module lids to be removably fit in said mounts;
a locking projection extending from each of said module lids into each of said mounts;
a slide switch for turning on or off the electronic device and said card modules on the electronic device; and an engaging member interlocking with the operation knob of said slide switch so as to be engaged with or disengaged from said locking projection of each of said module lids depending on the position of said slide switch.

3. A module mounting system for an electronic device, said mounting system comprising:
a plurality of recessed portions formed in the electronic device for receiving a corresponding plurality of card modules;
a plurality of lid members for each said plurality of card modules, each said lid member including a locking projection defining a locking groove;
means for selectively engaging each of said plurality of locking grooves for selectively locking or releasing each said plurality of lid members; and
contact means for supplying power to said electronic device, said contact means being positioned to connect with said means for selectively engaging;
whereby power to said electronic device is turned on when said means for selectively engaging is both connected with said contact means and disengaged from each of said plurality of locking grooves and whereby power to said electronic device is turned OFF when said means for selectively engaging is connected with at least one of said plurality of locking grooves thereby enabling removal of one or more of said plurality of card modules only when said power to said electronic device is OFF.

4. The module mounting system according to claim 3, wherein said means for selectively engaging includes an inverted U-shaped spring member having terminal ends for engaging said contact means, a slide switch positioned to receive said inverted U-shaped member, and an engaging member connected to said slide switch for selectively engaging with the locking grooves of said locking projections for each of said plurality of lid members, whereby actuation of said slide switch causes simultaneous engagement of said engaging member with at least one of said locking grooves and termination of power to said electronic device by removal of said inverted U-shaped member from said contact means.

* * * * *